US008149174B2

(12) United States Patent
Cornwell

(10) Patent No.: US 8,149,174 B2
(45) Date of Patent: Apr. 3, 2012

(54) ANTENNA SYSTEM

(75) Inventor: James Cornwell, Ruther Glen, VA (US)

(73) Assignee: Kaonetics Technologies, Inc., Inyokern, CA (US)

(*) Notice: Subject to any disclaimer, the term of this patent is extended or adjusted under 35 U.S.C. 154(b) by 0 days.

(21) Appl. No.: 12/775,203

(22) Filed: May 6, 2010

(65) Prior Publication Data

US 2010/0214182 A1 Aug. 26, 2010

Related U.S. Application Data

(63) Continuation of application No. 11/882,211, filed on Jul. 31, 2007, now Pat. No. 7,733,280, which is a continuation of application No. PCT/US2006/004779, filed on Feb. 13, 2006.

(60) Provisional application No. 60/651,627, filed on Feb. 11, 2005.

(51) Int. Cl.

| | |
|---|---|
| ***H01Q 1/38*** | (2006.01) |
| ***H01Q 1/48*** | (2006.01) |
| ***G01R 29/08*** | (2006.01) |

(52) U.S. Cl. ................. 343/703; 343/700 MS; 343/770; 343/779; 343/846

(58) Field of Classification Search ........... 343/700 MS, 343/727, 779, 829, 830, 846, 893, 703, 770
See application file for complete search history.

(56) References Cited

U.S. PATENT DOCUMENTS

| | | | | |
|---|---|---|---|---|
| 4,218,682 | A * | 8/1980 | Frosch et al. | 343/700 MS |
| 4,356,492 | A | 10/1982 | Kaloi | |
| 4,672,386 | A * | 6/1987 | Wood | 343/770 |
| 4,814,777 | A * | 3/1989 | Monser | 343/727 |
| 6,310,582 | B1 * | 10/2001 | Uetake et al. | 343/765 |
| 6,556,173 | B1 * | 4/2003 | Moustakas et al. | 343/725 |
| 6,639,558 | B2 * | 10/2003 | Kellerman et al. | 343/700 MS |
| 7,079,078 | B2 * | 7/2006 | Yuanzhu | 343/700 MS |
| 7,710,342 | B2 * | 5/2010 | Schadler et al. | 343/797 |
| 2003/0030588 | A1 | 2/2003 | Kalis et al. | |
| 2003/0146876 | A1 | 8/2003 | Greer et al. | |

FOREIGN PATENT DOCUMENTS

| | | |
|---|---|---|
| EP | 0487053 | 5/1992 |
| JP | 51-132058 | 11/1976 |
| WO | WO2004/093240 | 10/2004 |

OTHER PUBLICATIONS

Partial Search Report issued on Jun. 11, 2011 in European Patent Appln. No. 11168135.9.

* cited by examiner

*Primary Examiner* — Douglas W Owens
*Assistant Examiner* — Chuc Tran
(74) *Attorney, Agent, or Firm* — Stroock & Stroock & Lavan LLP

(57) ABSTRACT

An antenna system includes plural antennas. Each antenna is different than every other antenna. Each antenna is characterized by a principal plane. A principal plane of a first antenna is oblique to a principal plane of a second antenna. The first antenna includes a first insulating substrate extending in the principal plane of the first antenna. The first antenna further includes a first radiating element and a connected first conductor and includes a second radiating element and a connected second conductor. The first antenna further includes a coupling conductor coupling the second radiating element and the first conductor. The first antenna further includes a first coupler having a first signal conductor and a second signal conductor. The first signal conductor is coupled to the second conductor, and the second signal conductor is coupled to the first radiating element.

54 Claims, 13 Drawing Sheets

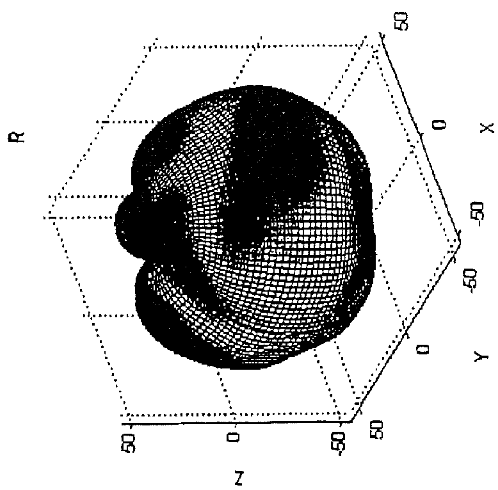
FIG. 11
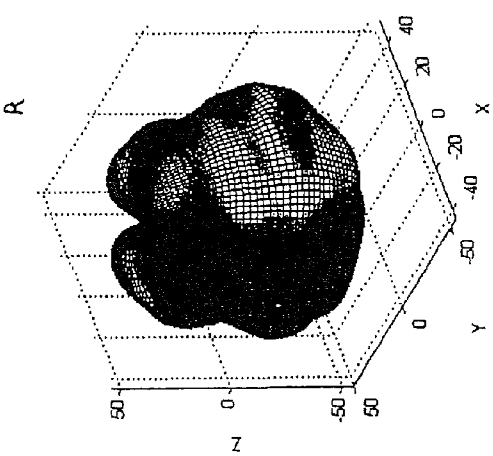
FIG. 12
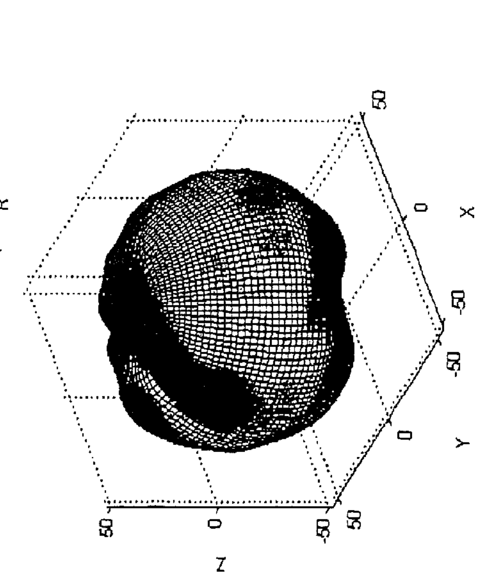
FIG. 13
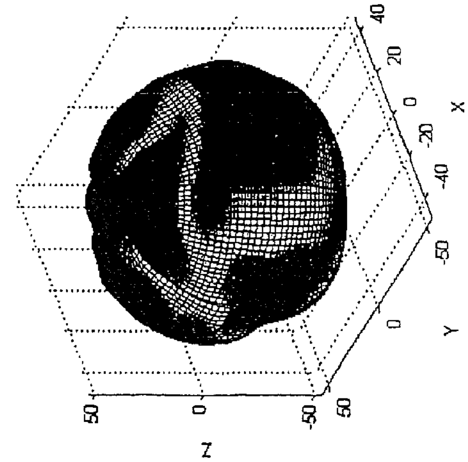
FIG. 14

011705 - 800 - 1000 MHz Monopole$_R$un 2 - 900.txt, LH pol

011705 - 800 - 1000 MHz Monopole$_R$un 2 - 900.txt, RH pol

011705 - 2400 - 2485 MHz Monopole$_R$un 2 - 2450.txt, LH pol

011705 - 2400 - 2485 MHz Monopole$_R$un 2 - 2450.txt, RH pol

011705 - 1800 - 1900 MHz MonopoleRun 2 - 1850.txt, LH pol

011705 - 1800 - 1900 MHz MonopoleRun 2 - 1850.txt, RH pol

011705 - 462 - 468 MHz Monopole$_R$un 2 - 465.txt, LH pol

011705 - 462 - 468 MHz Monopole$_R$un 2 - 465.txt, RH pol

ANTENNA SYSTEM

BACKGROUND OF THE INVENTION

This application is a Continuation of U.S. patent application Ser. No. 11/882,211, filed on Jul. 31, 2007 now U.S. Pat. No. 7,733,280, which is a Continuation of International Application Number PCT/US2006/004779, filed on Feb. 13, 2006, which claims the benefit of the filing date of U.S. Provisional Application Ser. No. 60/651,627, filed on Feb. 11, 2005, which is incorporated by reference herein.

FIELD OF THE INVENTION

The present invention relates to antenna systems. In particular, the invention relates to broadband omni directional antenna systems.

DESCRIPTION OF RELATED ART

Known omni directional systems radiate to provide 360 degree coverage on a plane with elevations plus or minus of the plane. Very few truly omni directional antenna systems are known to create coverage in three dimensions on a unit sphere. Difficulties are encountered that include, for example, the feed point through the sphere causes distortion of the radiation pattern, metal structures near the antenna cause reflections that distort the radiation pattern, and the individual radiating element of an antenna inherently does not produce a spherical radiation pattern. In addition, providing a spherical radiation pattern over a broad band of frequencies can be extremely difficult. Antenna structures intended to shape the radiation pattern at one frequency can cause distortion in the radiation pattern at another frequency.

SUMMARY OF THE INVENTION

An antenna system includes plural antennas. Each antenna is different than every other antenna. Each antenna is characterized by a principal plane. A principal plane of a first antenna is oblique to a principal plane of a second antenna. The first antenna includes a first insulating substrate extending in the principal plane of the first antenna. The first antenna further includes a first radiating element and a connected first conductor and includes a second radiating element and a connected second conductor. The first antenna further includes a coupling conductor coupling the second radiating element and the first conductor. The first antenna further includes a first coupler having a first signal conductor and a second signal conductor. The first signal conductor is coupled to the second conductor, and the second signal conductor is coupled to the first radiating element.

BRIEF DESCRIPTION OF DRAWINGS

The invention will be described in detail in the following description of preferred embodiments with reference to the following figures.

FIGS. 11 and 12 are views of a three dimensional representation of a first measured radiation pattern of the antenna system depicted in FIGS. 7 and 8 over the frequency band 300 MHz to 500 MHz for right hand circular polarization and left hand circular polarization, respectively.

FIGS. 13 and 14 are views of a three dimensional representation of a second measured radiation pattern of the antenna system depicted in FIGS. 7 and 8 over the frequency band 300 MHz to 500 MHz for right hand circular polarization and left hand circular polarization, respectively.

DETAILED DESCRIPTION OF PREFERRED EMBODIMENTS

Figure 2:
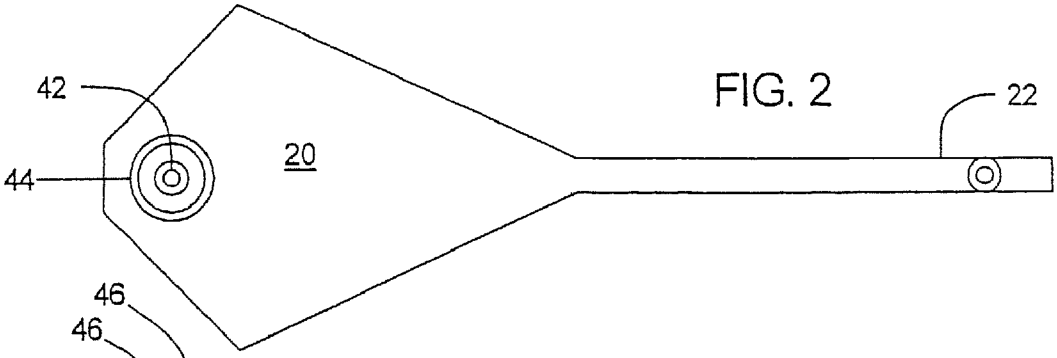
FIGS. 2 and 3 are plan views of the antenna of FIG. 1 from the obverse and reverse sides, respectively.
Figure 1:
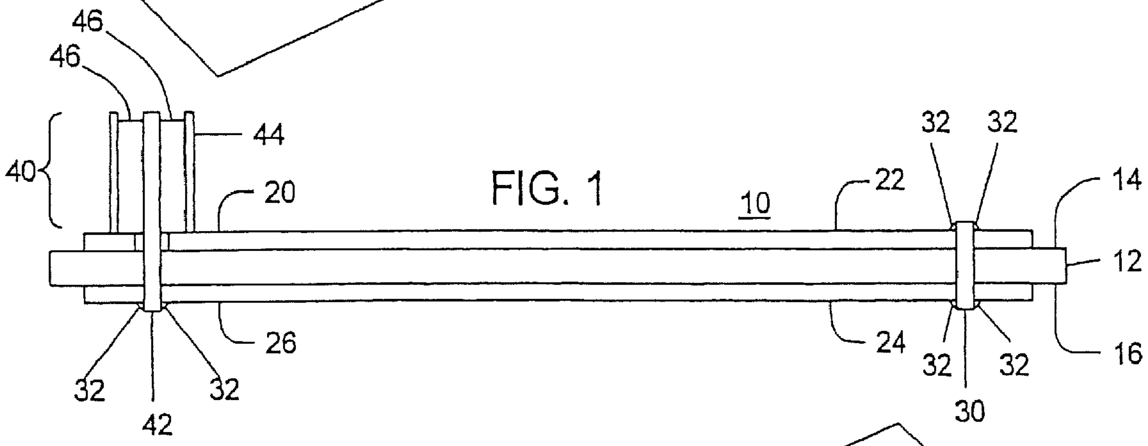
FIG. 1 is a sectional view of an antenna as might be used in an embodiment of an antenna system according to the invention.
Figure 3:
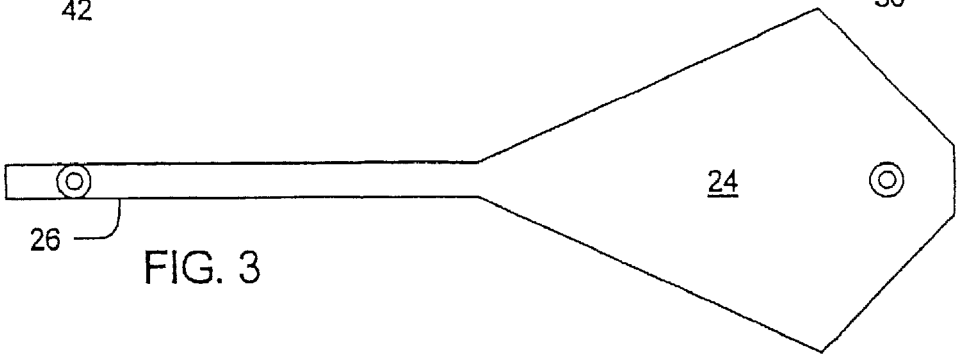

In FIGS. 1-3, an antenna 10 includes a planar shaped insulating substrate 12 extending in a principal plane of the antenna. Insulating substrate 12 has an obverse side 14 and a reverse side 16. The antenna 10 further includes a first radiating element 20 and a connected first conductor 22 disposed on the obverse side 14 and also includes a second radiating element 24 and a connected second conductor 26 disposed on the reverse side 16. The antenna 10 further includes a coupling conductor 30 that couples the second radiating element 24 and the first conductor 22. The antenna 10 further includes a coupler 40 having a first signal conductor 42 and a second signal conductor 44. The first signal conductor 42 is coupled to the second conductor 26, and the second signal conductor 44 is coupled to the first radiating element 20.

In operation and as depicted in FIGS. 1-3, applied currents flow from signal conductor 42 through conductor 26, through radiating element 24, through coupling conductor 30, through conductor 22, through radiating element 20 to conductor 44. When the currents are RF signal currents, at a broad bandwidth about certain frequencies, radiating elements 20 and 24 tend to resonate and operate as an antenna. The radiation that emanates from a radiating element tend to emanate from the edge of the element (e.g., the edge of the etched copper, generally flat, shape).

Antenna 10 has a shape similar to a "bow tie" antenna, and it functions as a broad band antenna. The two halves of the "bow tie" are preferably disposed on opposite sides of the insulating substrate 12, but may, in other variations, be formed on the same side. Antenna 10 is preferably fed from an end point instead of a center point as is common with "bow tie" style antennas. However, in other variations, antenna 10 may be fed from other point, such as the center. In one variation of this antenna, the entire antenna is formed from a double sided copper clad epoxy-glass printed wiring board. In such case, conductor 30 is typically a plated through hole, but may be a rivet or pin held in place by solder filets 32 as depicted in FIGS. 1-3. Other manufactures of the same structure are equivalent. The coupler 40 may be an SMC connector, a BNC connector or other connector suitable at RF frequencies. Typically, the coupler 40 will have insulating dielectric material between conductor 42 and conductor 44.

Figure 4:
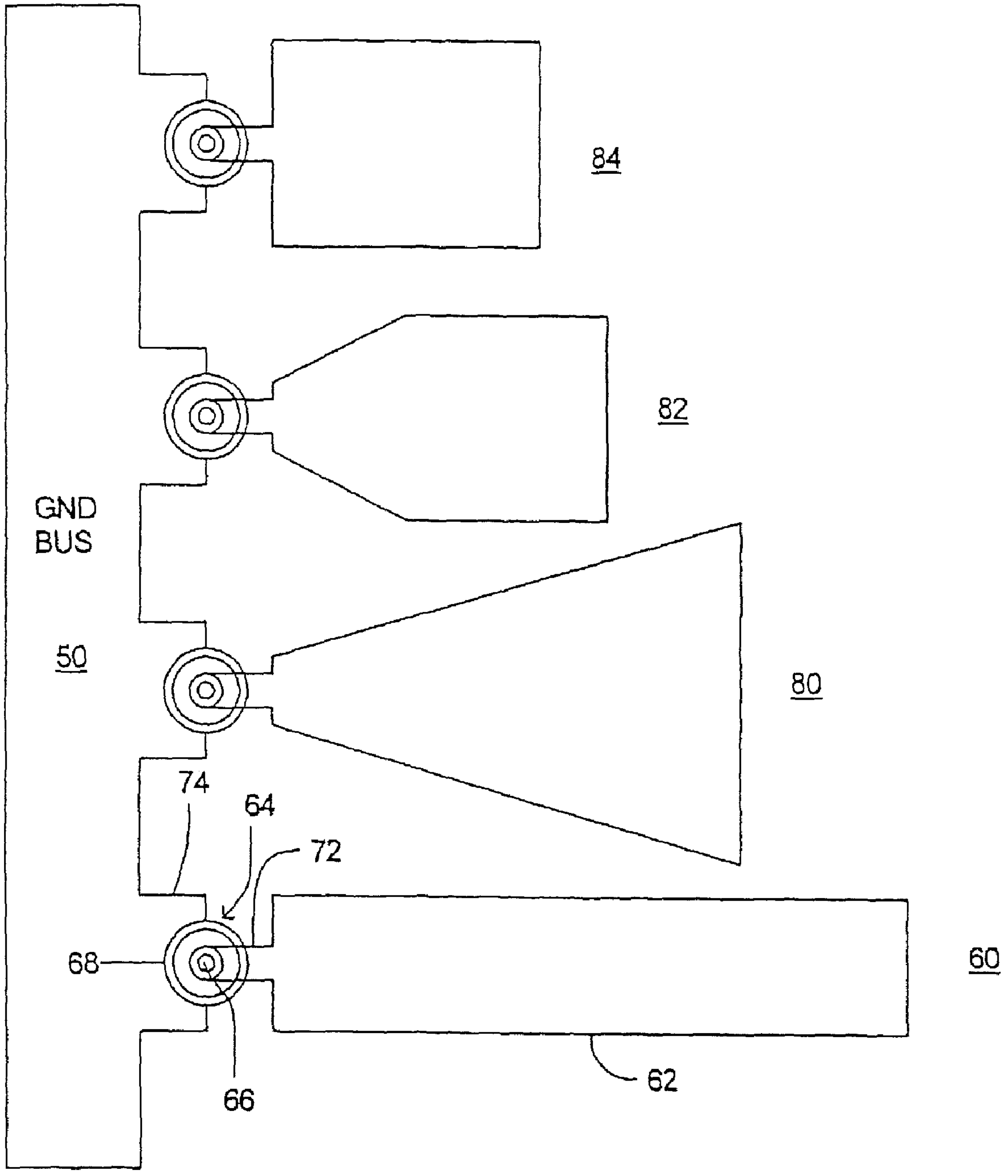
FIG. 4 is a plan view of several antennas as might be used in an embodiment of the antenna system according to the invention.

In FIG. 4, plural antennas are depicted. These antennas are formed on a planar shaped insulating substrate extending in a principal plane of the plural antennas. Each antenna is formed from conductive material, preferably copper, disposed on an obverse side of the insulating substrate. Antenna 60 includes an antenna radiating element 62 and at least a portion a ground conductor 50 (also referred to as ground bus 50) disposed on the obverse side of the insulating substrate. Antenna 60 further includes a coupler 64 having a first signal conductor 66 and a second signal conductor 68. A feed connects coupler 64 to ground conductor 50 and antenna radiating element 62. In particular, the first signal conductor 66 of the coupler 64 is coupled through a first feed portion 72 to the radiating element 62, and the second signal conductor 68 of the coupler 64 is coupled through a second feed portion 74 to the ground conductor 50.

In operation, applied RF signal currents fed through coupler 64 pass though feed portions 72, 74 into ground bus 50 and radiating element 62. From there, electric fields extend between ground bus 50 and the radiating element 62 in such a way to cause RF signals to radiate from antenna 60.

In alternative embodiments, any one or more of antennas 80, 82 and 84 are similarly formed on the same insulating substrate. Each alternative antenna embodiment is varied by size and shape to meet frequency requirements and impedance matching requirements according to "patch radiator" technology. The size and shape of the feed portions 72, 74 are defined to match impedances from the coupler 64 to the radiating element of the antenna.

Figure 5:
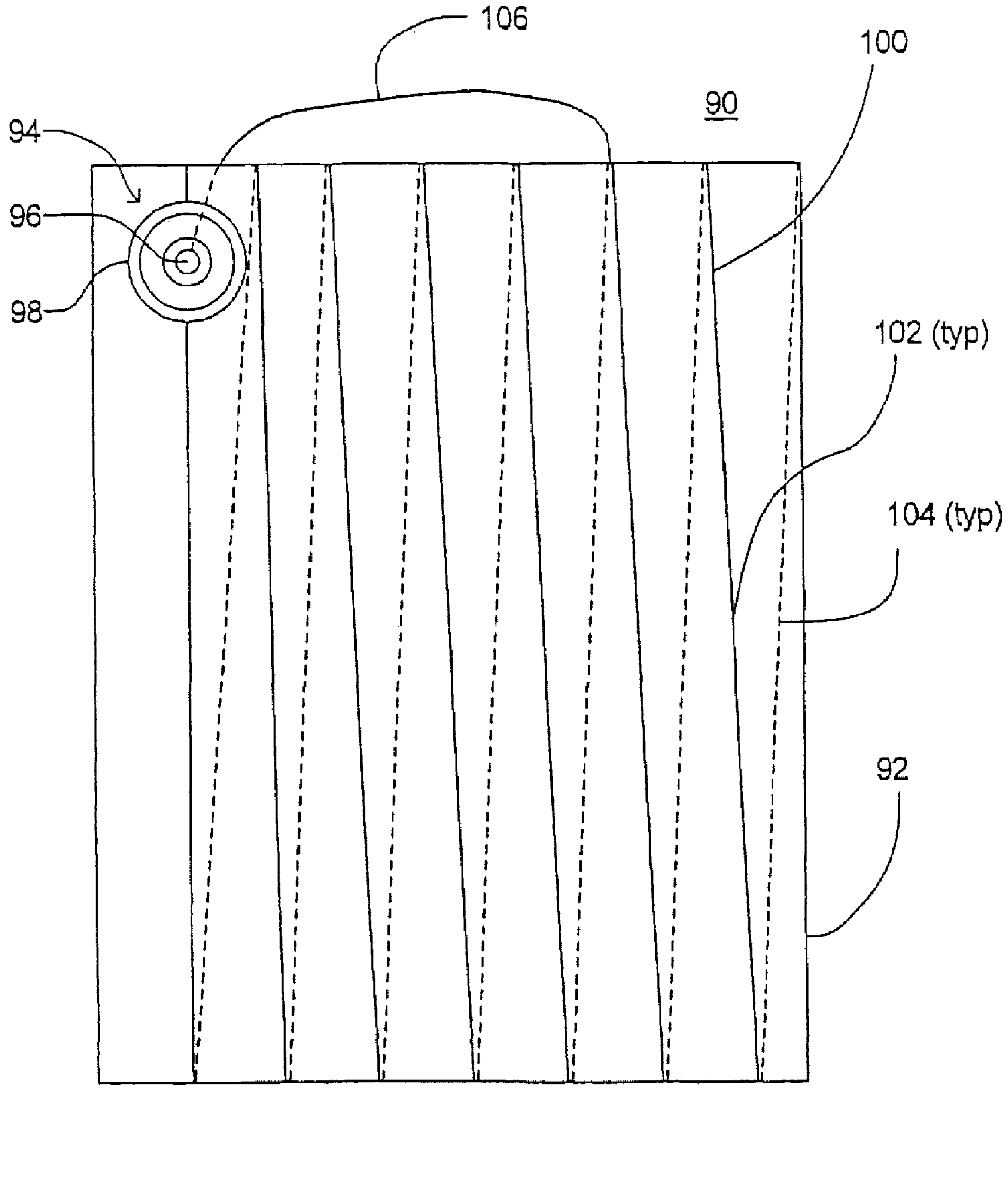
FIG. 5 is a plan view of another antenna as might be used in an embodiment of the antenna system according to the invention.
Figure 6:
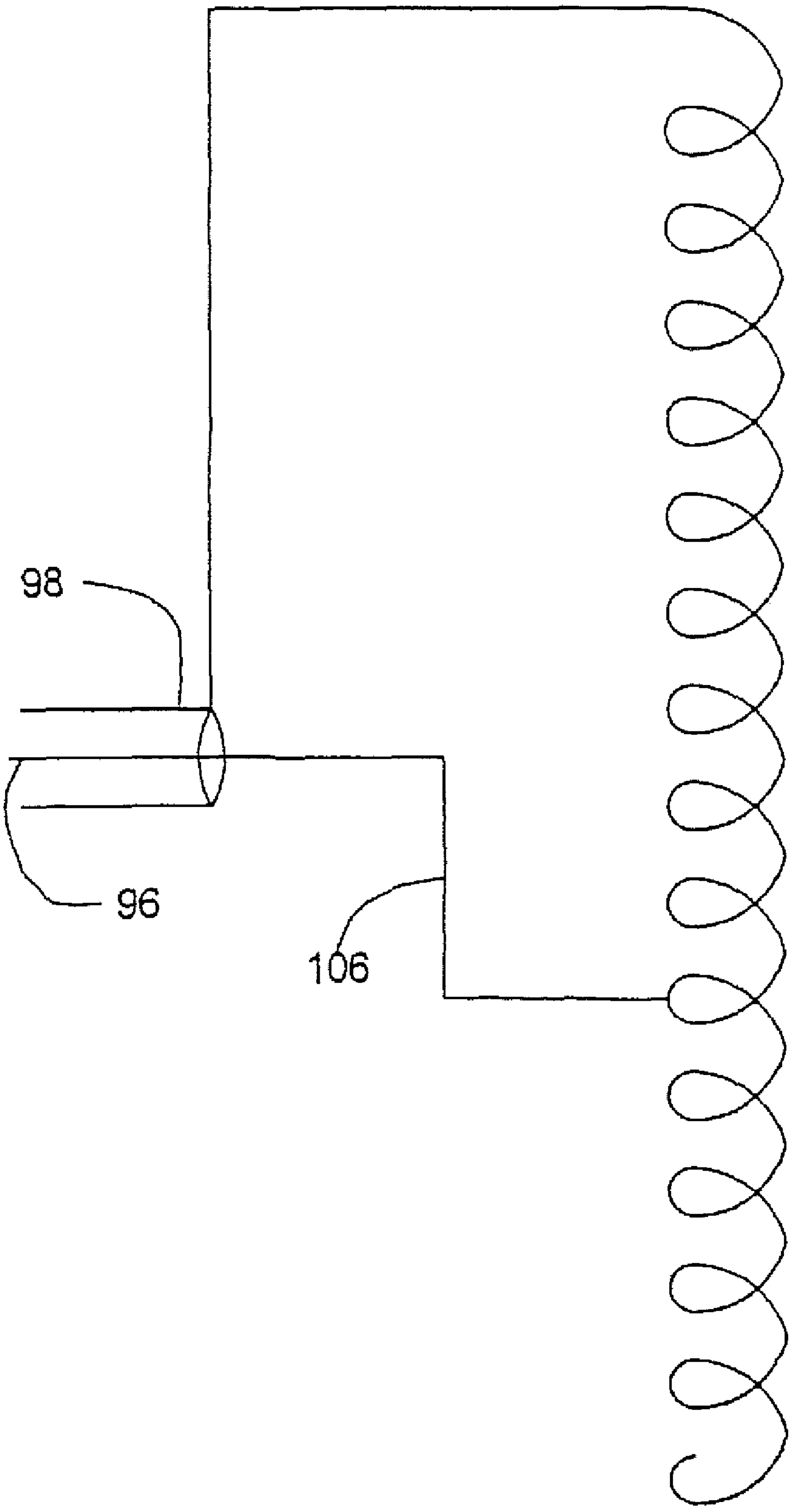
FIG. 6 is a schematic diagram of the antenna of FIG. 5.

In FIGS. 5-6, an antenna 90 includes a planar shaped insulating substrate 92 extending in a principal plane of the antenna. Insulating substrate 92 has an obverse side and a reverse side. Antenna 90 further includes a coupler 94 having a first signal conductor 96 and a second signal conductor 98. Antenna 90 further includes a wire 100 wound in plural turns around the insulating substrate 92. One half of each turn (collectively 102) extends across the obverse side of the substrate, and the other half of each turn (collectively 104) extends across the reverse side of the substrate. In an example of antenna 90, there are 32 turns in the winding. In one example, wire 100 is a wire having a diameter defined by an American Wire Gauge number selected from a range that vary from AWG 18 to AWG 30. If greater current is anticipated, AWG 16 wire might be used. Alternatively, other forms of conductor wires might be used; for example, the wire may be a flat ribbon conductor. The insulating substrate 92 might be an epoxy-glass substrate double clad with copper conductor and etched to form half turns 102 on the obverse side and half turns 104 on the reverse side. The ends of the half turns on the obverse side are connected to the ends of the half turns on the reverse side with plated through holes, rivets, pins or other through conductors as discussed with respect to FIGS. 1-3.

Antenna 90 further includes a tap conductor 106 coupled between the first signal conductor 96 of coupler 94 and a predetermined one of the plural turns of the wire 100. The predetermined turn number is determined during early design stages and may be easily defined by trying several different turn numbers and measuring the antenna's performance. A first end of the plural turns of wire 100 is coupled to the second signal conductor 98.

In operation, applied RF signal currents fed through coupler 94 pass though conductor 96, through tap wire 106 to the predetermined one of the plural turns of wire 100, and from there through a portion of wire 100 to the first end of wire 100 to conductor 98.

Figure 7:
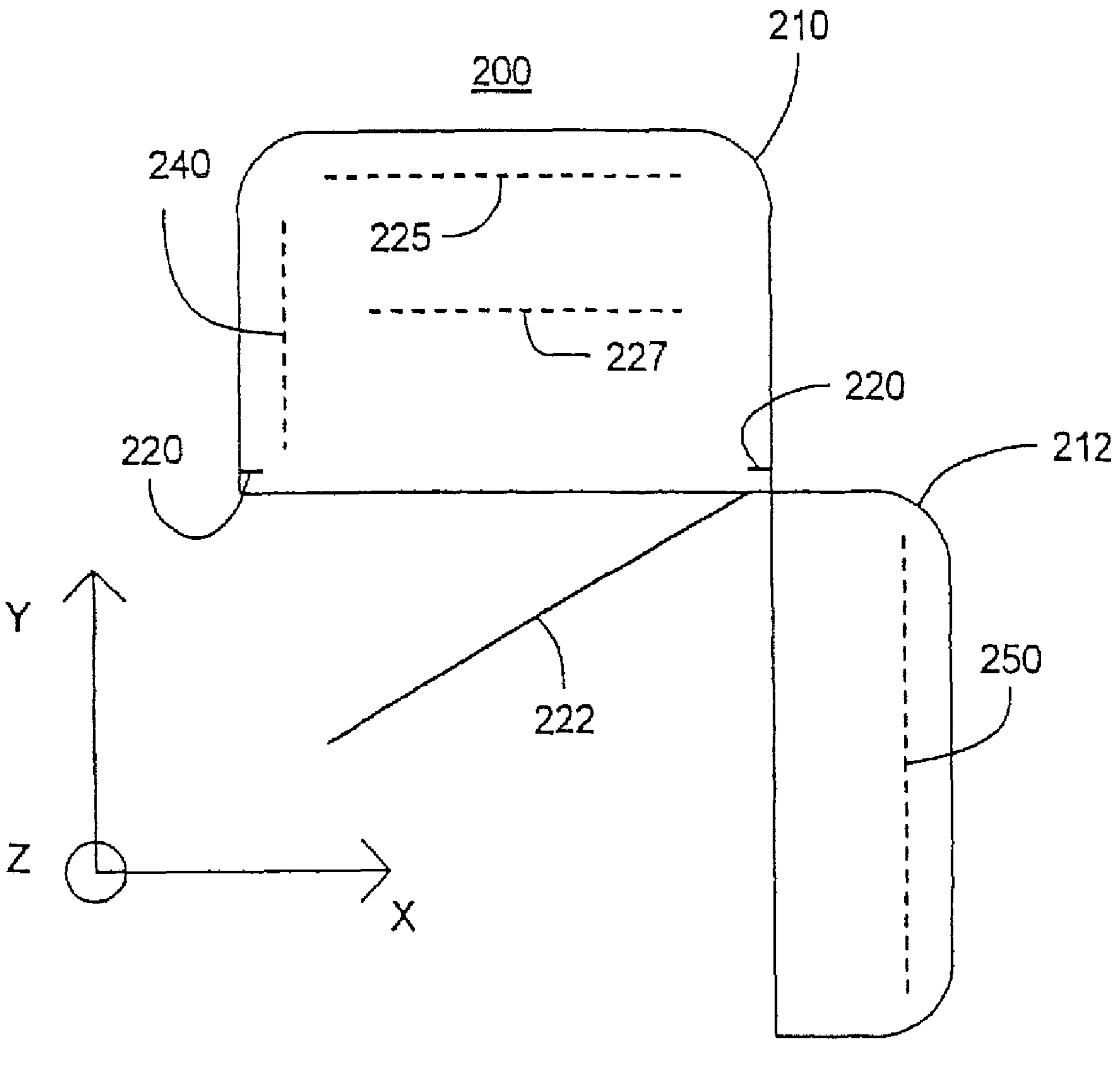
FIGS. 7 and 8 are two orthogonal views of an embodiment of an antenna system according to the invention.
Figure 8:
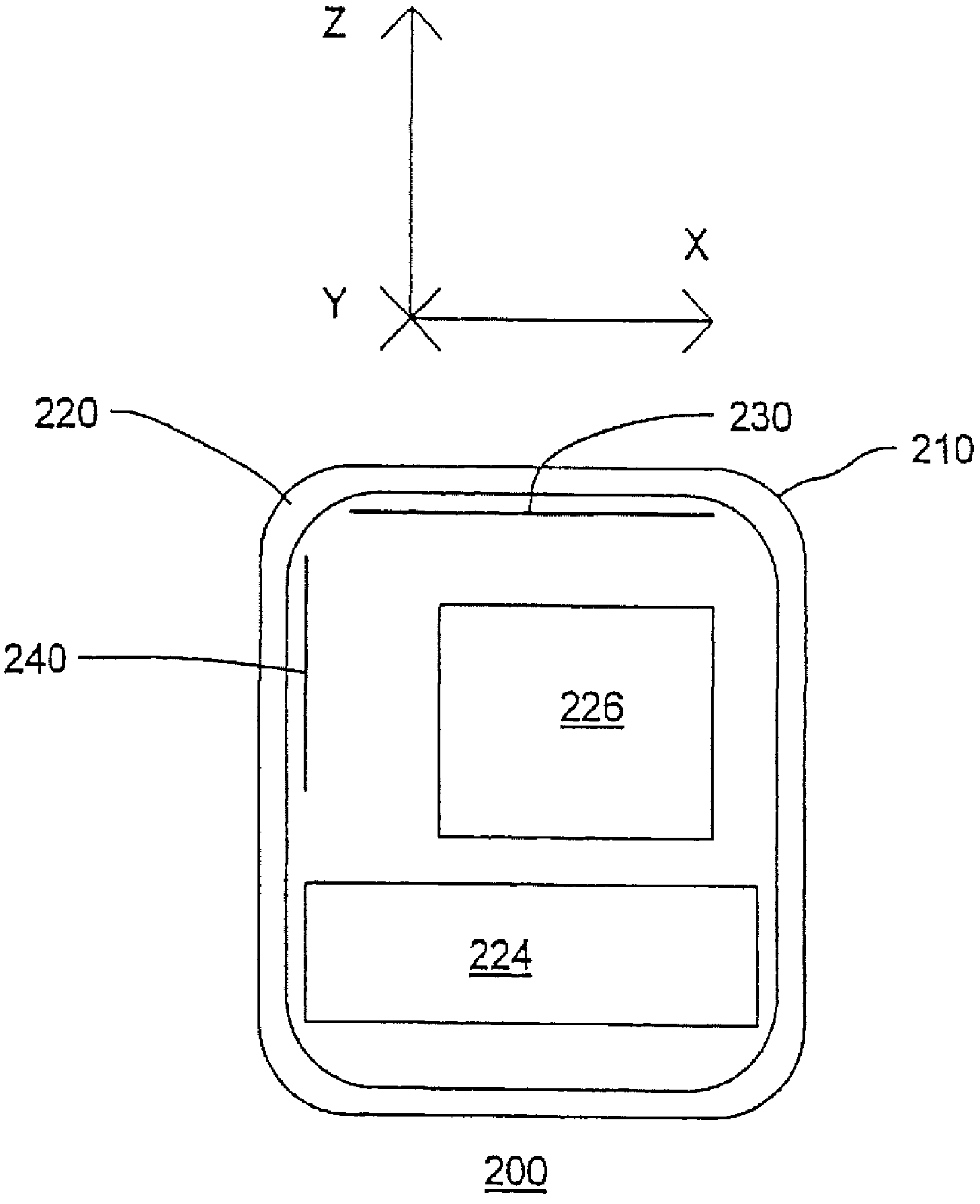

In FIGS. 7-8 an antenna system 200 is depicted. Antennas are mounted within portable case 210 and lid 212. Additionally, conductive control panel 222 is mounted to case 210, preferably by hinges. The case and lid are formed from a non-conductive material such as high impact resistant plastic or rubber. A conductive grounding ring 220 is installed inside the case. Electronic modules 224 and 226 are also installed in the case. Electronic module 224 has an equivalent conductive plane 225, and electronic module 226 has an equivalent conductive plane 227.

The electronic modules may be placed in locations other than those depicted in FIGS. 7 and 8; however, since their equivalent conductive plane may operate as a partial ground plane and reflect RF signals radiated from the antennas, the location of the electronic modules must be taken into account at the time of the design of antenna system 200. Different size, weight, cooling, RF signal and battery power requirements may be imposed on antenna system 200, depending on the application. Therefore, the locations depicted in FIGS. 7 and 8 should be regarded as a starting point and the locations and specific antenna parameters are adjusted to meet imposed requirements.

In a first embodiment of an antenna system, the antenna system includes plural antennas. Each antenna is different than every other antenna, and each antenna is characterized by a principal plane. A principal plane of a first antenna 230 is oblique to a principal plane of a second antenna. The second antenna may be located and oriented as depicted by antenna 240 or 250 in FIGS. 7-8. Much as is described with respect to the antenna depicted in FIGS. 1-3, the first antenna 230 includes a first insulating substrate extending in the principal plane of the first antenna. The first antenna further includes a first radiating element and a connected first conductor and includes a second radiating element and a connected second conductor. The first antenna further includes a coupling conductor coupling the second radiating element and the first conductor. The first antenna further includes a first coupler having a first signal conductor and a second signal conductor. The first signal conductor is coupled to the second conductor, and the second signal conductor is coupled to the first radiating element. The first antenna 230 is not shown in FIG. 7 for clarity, but FIG. 8 depicts an end view of the first antenna 230. The principal plane of the first antenna 230 extends in the X and Y directions. The principal planes of the first and second antennas are oblique; however, in some variants, the planes are substantially orthogonal.

In a first variant of the first embodiment of the antenna system, the second antenna is located and oriented as antenna 240 in FIGS. 7-8. Much as is described with respect to the antenna depicted in FIG. 4, second antenna 240 includes a second insulating substrate extending in the principal plane of the second antenna. The second antenna further includes a second antenna radiating element, a ground conductor, a second coupler and a feed. The second coupler includes a first signal conductor and a second signal conductor. The first signal conductor of the second coupler is coupled to the second antenna radiating element, and the second signal conductor of the second coupler is coupled to the ground conductor. The principal plane of the second antenna 240 extends in the Z and Y directions.

In an example of the first variant of the first embodiment of the antenna system and much as is described with respect to the antenna depicted in FIG. 5, the plural antennas further include a third antenna, and the third antenna 250 includes a third insulating substrate extending in a principal plane of the third antenna. The third antenna further includes a third coupler having first and second signal conductors. The third antenna further includes a wire wound in plural turns around the third insulating substrate and having a first end coupled to the second signal conductor. The third antenna further includes a tap conductor coupled between the first signal conductor and a predetermined one of the plural turns of the wire. The principal plane of the third antenna 250 extends in the Z and Y directions.

In a first mechanization, the principal planes of the first and third antennas 230, 250 are oblique; and possibly substantially orthogonal.

In an example of the first mechanization, the principal planes of the second and third antennas 240, 250 are substantially parallel.

In a second mechanization, the principal planes of the second and third antennas 240, 250 are substantially parallel.

In a second variant of the first embodiment of the antenna system, the second antenna is located and oriented as antenna 250 in FIGS. 7-8. Much as is described with respect to the antenna depicted in FIG. 5, second antenna 250 includes a planar shaped second insulating substrate extending in the principal plane of the second antenna. The second antenna further includes a second coupler having first and second signal conductors. The second antenna further includes a wire wound in plural turns around the second insulating substrate and having a first end coupled to the second signal conductor. The second antenna further includes a tap conductor coupled between the first signal conductor and a predetermined one of the plural turns of the wire. The principal plane of the second antenna 250 extends in the Z and Y directions.

In a second embodiment of an antenna system, the antenna system includes plural antennas. Each antenna is different than every other antenna, and each antenna is characterized by a principal plane. A principal plane of a first antenna is substantially parallel to a principal plane of a second antenna 240. Much as is described with respect to the antenna depicted in FIG. 4, the second antenna 240 includes a planar shaped insulating substrate extending in the principal plane of the second antenna and having an obverse side. The second antenna further includes a radiating element and a ground conductor disposed on the obverse side, a coupler having first and second signal conductors and a feed disposed on the obverse side. The first signal conductor is coupled to the radiating element, and the second signal conductor is coupled to the ground conductor.

In a first variant of the second embodiment of the antenna system, the first antenna is located and oriented as antenna 250 in FIGS. 7-8. Much as is described with respect to the antenna depicted in FIG. 5, first antenna 250 includes a planar shaped first insulating substrate extending in the principal plane of the first antenna. The first antenna further includes a first coupler having first and second signal conductors. The first antenna further includes a wire wound in plural turns around the first insulating substrate and having a first end coupled to the first signal conductor. The first antenna further includes a tap conductor coupled between the second signal conductor and a predetermined one of the plural turns of the wire.

In a third embodiment of an antenna system, the antenna system includes plural antennas. Each antenna is different than every other antenna, and each antenna is characterized by a principal plane. A principal plane of a first antenna 250 is oblique to a principal plane of a second antenna. The second antenna may be located and oriented as depicted by antenna 230 in FIGS. 7-8 or other locations. Much as is described with respect to the antenna depicted in FIG. 5, the first antenna 250 includes a first insulating substrate extending in a principal plane of the first antenna. The first antenna further includes a first coupler having first and second signal conductors. The first antenna further includes a wire wound in plural turns around the first insulating substrate and having a first end coupled to the first signal conductor. The first antenna further includes a tap conductor coupled between the second signal conductor and a predetermined one of the plural turns of the wire.

In many variants of the above embodiments, antennas designed substantially similarly to the antenna depicted in FIGS. 1-3, are designed to operate near resonance over a frequency range from 400 MHz to 500 MHz. This band covers an important FRS band at 462 MHz and another band at 434 MHz.

In many variants of the above embodiments, antennas designed substantially similarly to the antenna depicted at 60 in FIG. 4, are designed to operate near resonance over a frequency range from 462 MHz to 474 MHz. This band covers an important FRS band at 462 MHz and another bands at 474 MHz.

In many variants of the above embodiments, antennas designed substantially similarly to the antenna depicted at 80 in FIG. 4, are designed to operate near resonance over a frequency range from 1,800 MHz to 1,900 MHz. This band covers important cell phone bands.

In many variants of the above embodiments, antennas designed substantially similarly to the antenna depicted at 82 in FIG. 4, are designed to operate near resonance over a frequency range from 800 MHz to 900 MHz. This band covers important cell phone bands.

In many variants of the above embodiments, antennas designed substantially similarly to the antenna depicted at 84 in FIG. 4, are designed to operate near resonance over a frequency range from 2,400 MHz to 2,500 MHz. This band covers important cell phone bands.

In many variants of the above embodiments, antennas designed substantially similarly to the antenna depicted in FIG. 5, are designed to operate near resonance over a frequency range from 25 MHz to 200 MHz. This band covers an important data links at 27 MHz and 134 MHz to 138 MHz.

In a jammer operation, the antennas are fed by signal oscillators. While known broadband jammers require noise generators, with the present invention, inexpensive oscillators may be used. It should be noted that spectral purity of the oscillator is not a requirement. Waveforms distorted from pure sinusoidal waveforms merely add to the broadband coverage. The several antennas, located in the near radiation field (i.e., within 5 to 10 wavelengths) from each other, add to the distortion giving rise to a broadband effect. Signals radiated from one antenna excite parasitic resonance in other nearby antennas. The oscillators for a frequency range from 400 MHz to 500 MHz, for a frequency range from 800 MHz to 900 MHz, for a frequency range from 1,800 MHz to 1,900 MHz, and for a frequency range from 2,400 MHz to 2,500 MHz are located in electronic module 226 of FIG. 8. The oscillators for a frequency range from 25 MHz to 200 MHz and for 300 MHz to 500 MHz are located in electronic module 224. Other locations may be equivalent, but the system performance must be checked to ensure proper performance.

The overall antenna system is intended to work with the oscillators to disrupt communications in selected bands. When considering design balancing, the need for portable operation and long battery life gives rise to a need for low transmit power. However, high transmit power is generally needed to jam a data link. Long battery life is best achieved by ensuring that the radiation intensity pattern is efficiently used. Coverage for the system described is intended to be omni directional in three dimensions. Thus, the best antenna pattern is achieved when there are no main lobes with great antenna gain and no notches with below normal antenna gain. For at least this reason, placement of the antennas and all conductive elements (e.g., electronic modules 224 and 226) are very important, a requirement that become all the more difficult when another requirement of broadband jamming is required in selected bands.

The antenna system of FIGS. 7 and 8 was tested and measurements taken a various frequencies, polarizations and angles over the unit sphere. The measurement results were plotted and are reproduced in three dimension in FIGS. 11-30.

Figure 9:
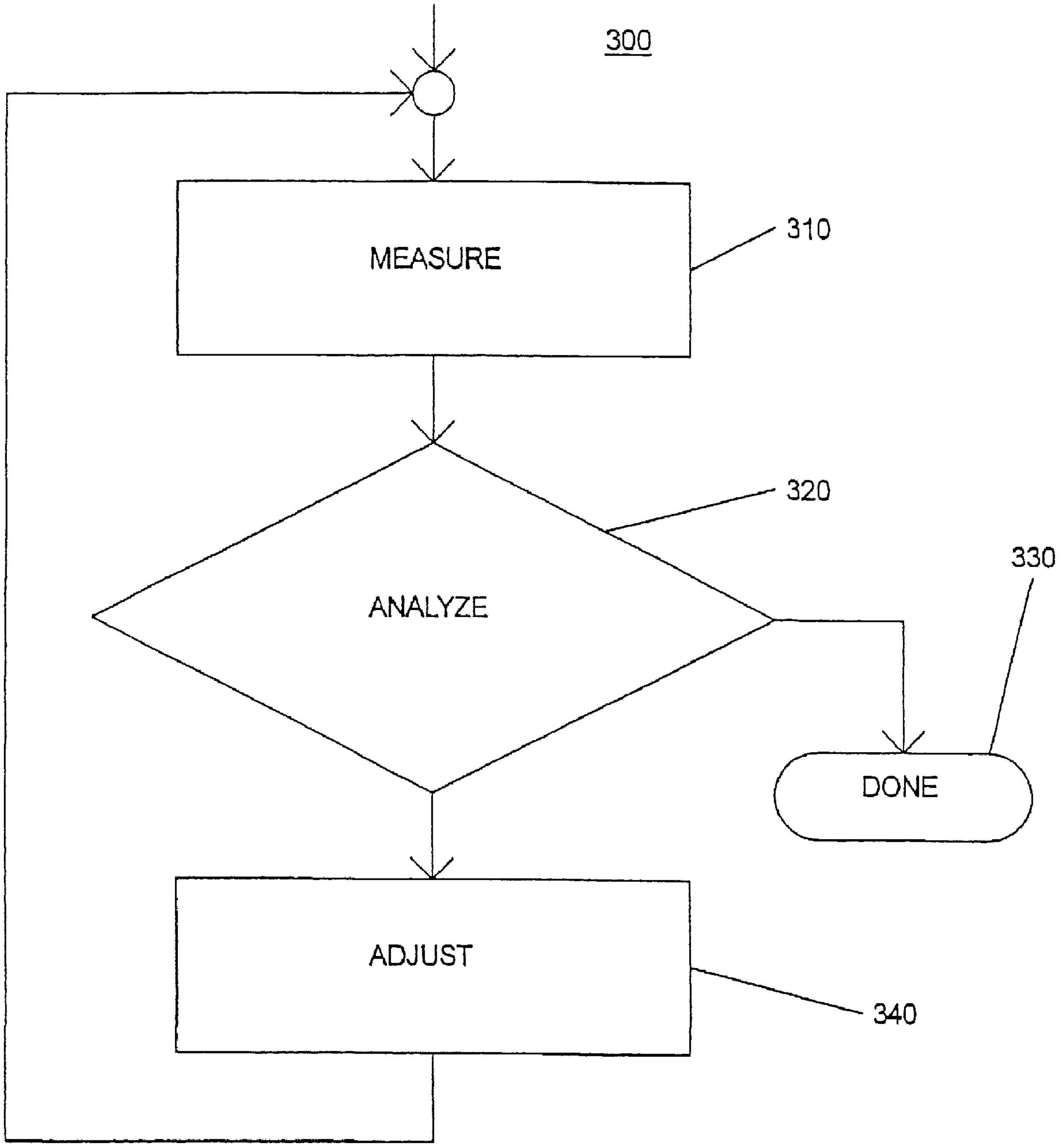
FIG. 9 is a flow chart of an embodiment of a process to tune an antenna system according to the invention.

To meet these stringent requirements, the design process 300 includes measuring performance, analyzing the results and adjusting the antennas' location, orientation and individual antenna design. In FIG. 9, the performance is measured at 310. The performance is measured in terms of antenna gain at angular intervals over an entire unit sphere. At each angular measurement point, the gain is measured at each frequency of interest for the design. The measured performance is analyzed at 320. If the gain is adequate at each angular position and at each frequency of interest, then the design is correctly adjusted and the design process is done at 330. If the performance is inadequate at either a spatial point or at a spectral point (i.e., a frequency point), then the design is adjusted at 340.

Figure 10:
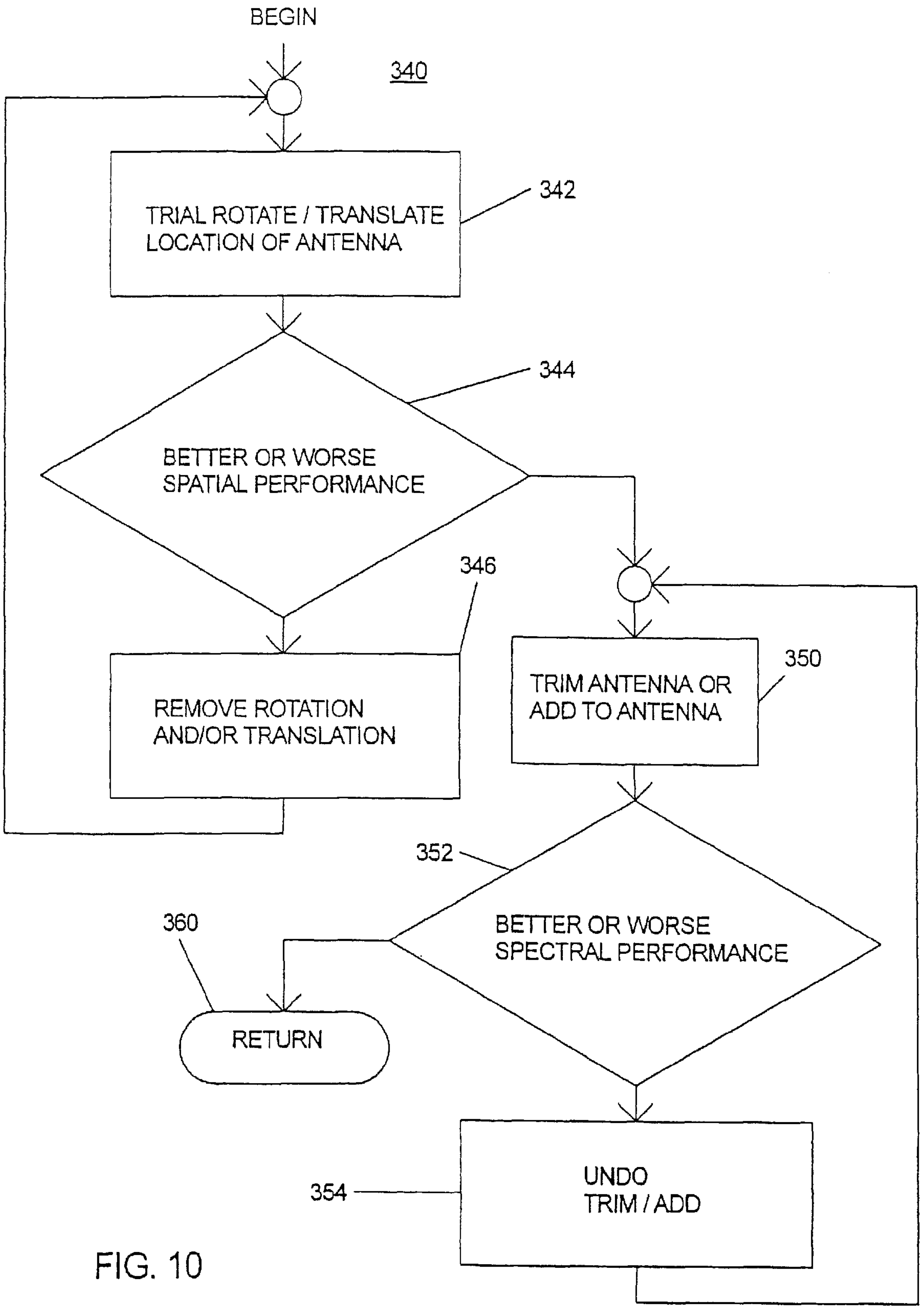
FIG. 10 is a flow chart of an embodiment of the adjust process of FIG. 9.
Figure 16:
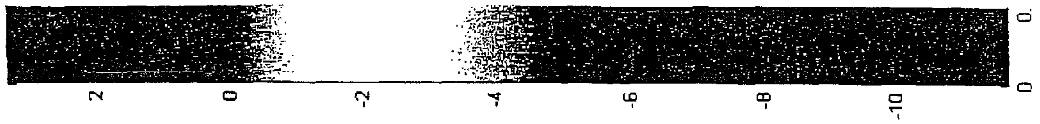
FIGS. 15 and 16 are views of a three dimensional representation of a first measured radiation pattern of the antenna system depicted in FIGS. 7 and 8 over the frequency band 800 MHz to 1,000 MHz for right hand circular polarization and left hand circular polarization, respectively.
Figure 16:
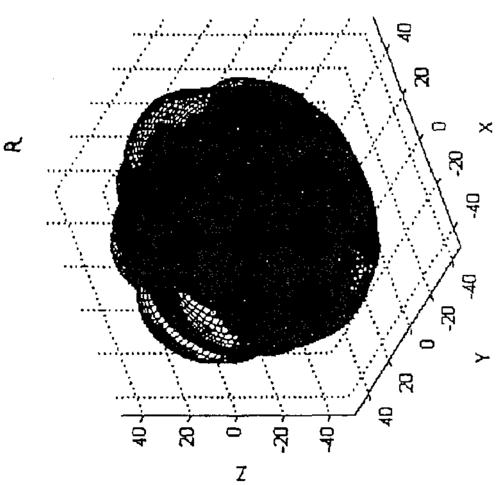
Figure 18:
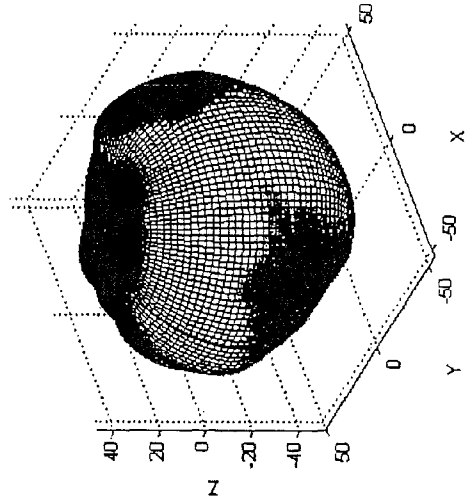
FIGS. 17 and 18 are views of a three dimensional representation of a second measured radiation pattern of the antenna system depicted in FIGS. 7 and 8 over the frequency band 800 MHz to 1,000 MHz for right hand circular polarization and left hand circular polarization, respectively.
Figure 15:
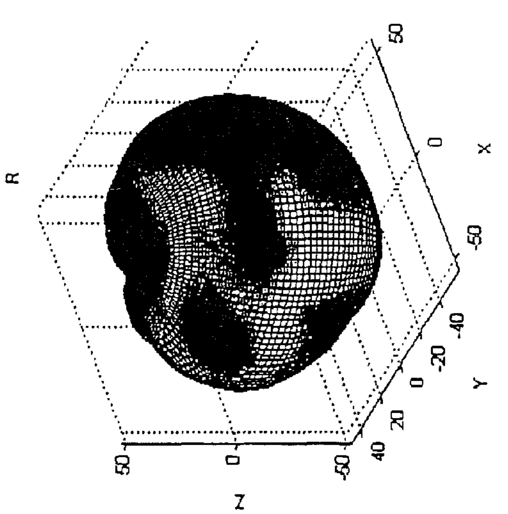
Figure 17:
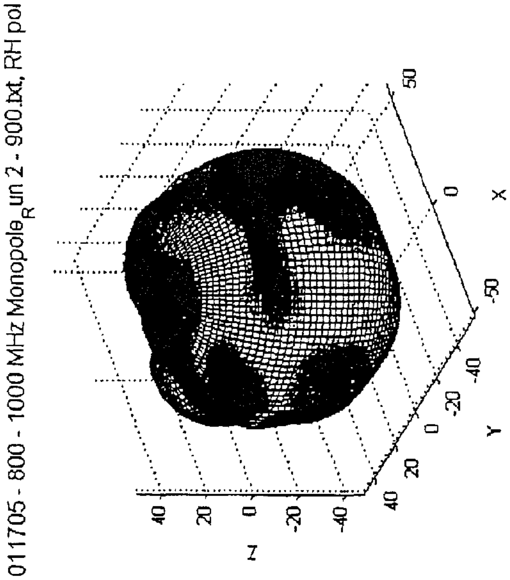
Figure 20:
FIGS. 19 and 20 are views of a three dimensional representation of a first measured radiation pattern of the antenna system depicted in FIGS. 7 and 8 over the frequency band 2,400 MHz to 2,485 MHz for right hand circular polarization and left hand circular polarization, respectively.
Figure 20:
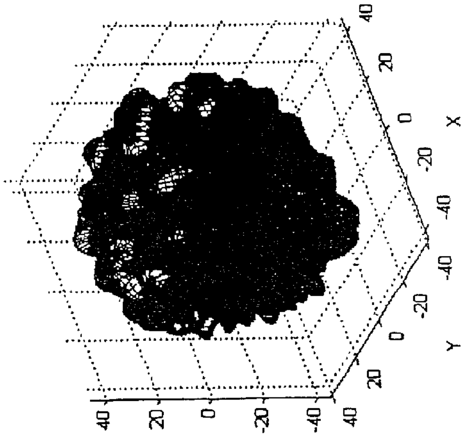
Figure 22:
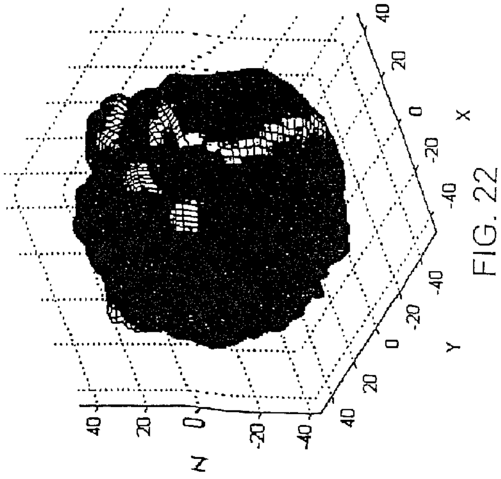
FIGS. 21 and 22 are views of a three dimensional representation of a second measured radiation pattern of the antenna system depicted in FIGS. 7 and 8 over the frequency band 2,400 MHz to 2,485 MHz for right hand circular polarization and left hand circular polarization, respectively.
Figure 19:
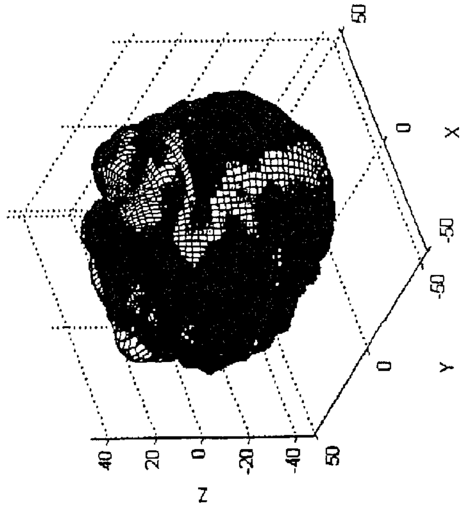
Figure 21:
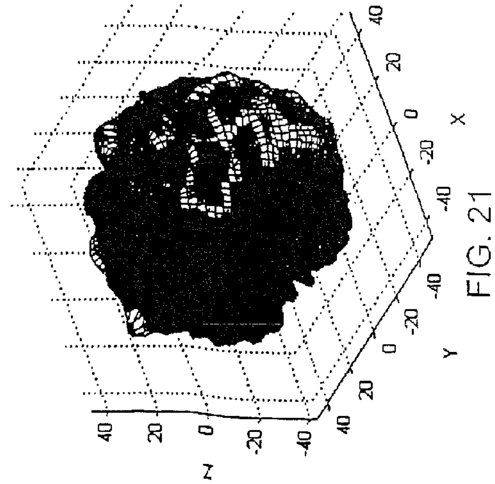
Figure 24:
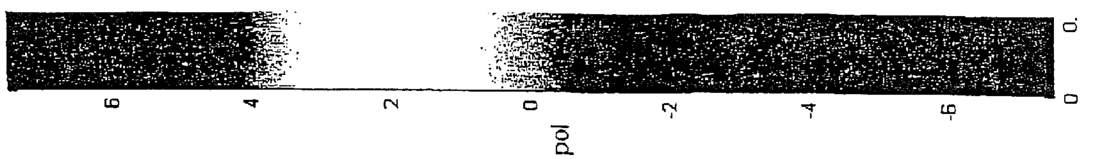
FIGS. 23 and 24 are views of a three dimensional representation of a first measured radiation pattern of the antenna system depicted in FIGS. 7 and 8 over the frequency band 1,800 MHz to 1,900 MHz for right hand circular polarization and left hand circular polarization, respectively.
Figure 24:
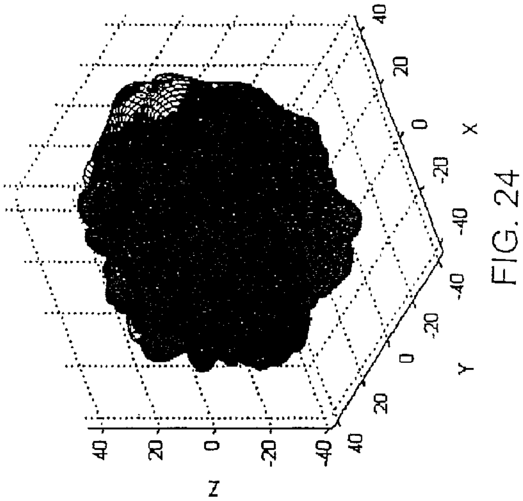
Figure 26:
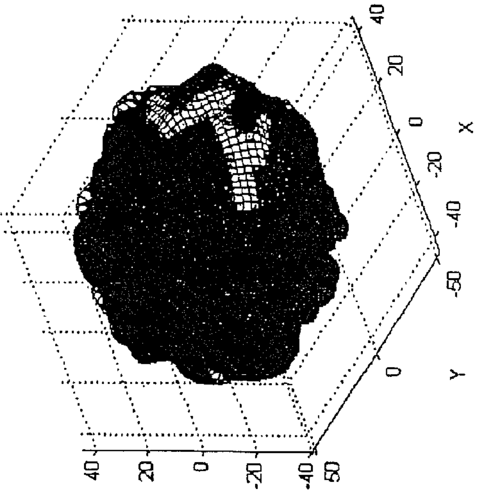
FIGS. 25 and 26 are views of a three dimensional representation of a second measured radiation pattern of the antenna system depicted in FIGS. 7 and 8 over the frequency band 1,800 MHz to 1,900 MHz for right hand circular polarization and left hand circular polarization, respectively.
Figure 23:
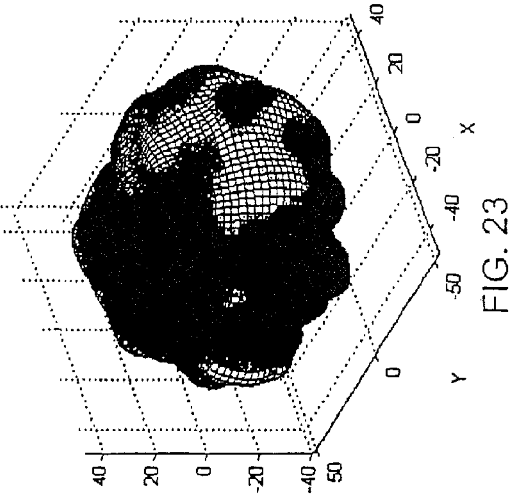
Figure 25:
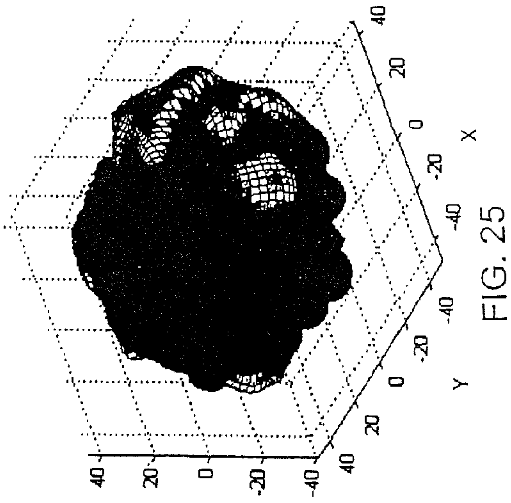
Figure 28:
FIGS. 27 and 28 are views of a three dimensional representation of a first measured radiation pattern of the antenna system depicted in FIGS. 7 and 8 over the frequency band 462 MHz to 468 MHz for right hand circular polarization and left hand circular polarization, respectively.
Figure 28:
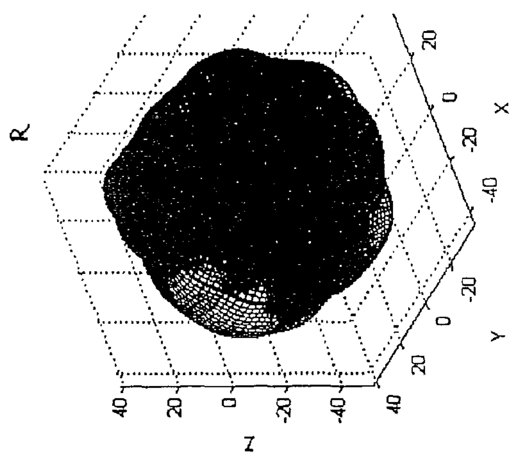
Figure 30:
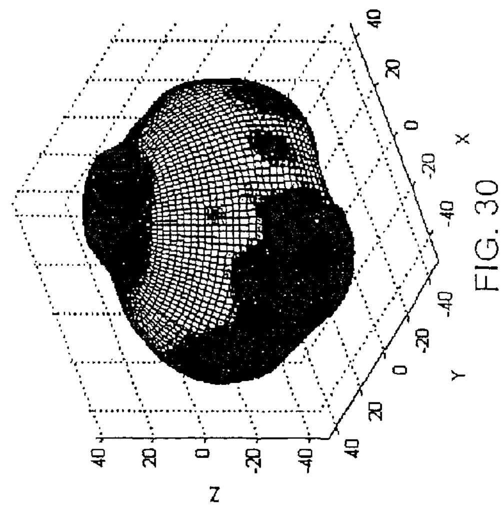
FIGS. 29 and 30 are views of a three dimensional representation of a second measured radiation pattern of the antenna system depicted in FIGS. 7 and 8 over the frequency band 462 MHz to 468 MHz for right hand circular polarization and left hand circular polarization, respectively.
Figure 27:
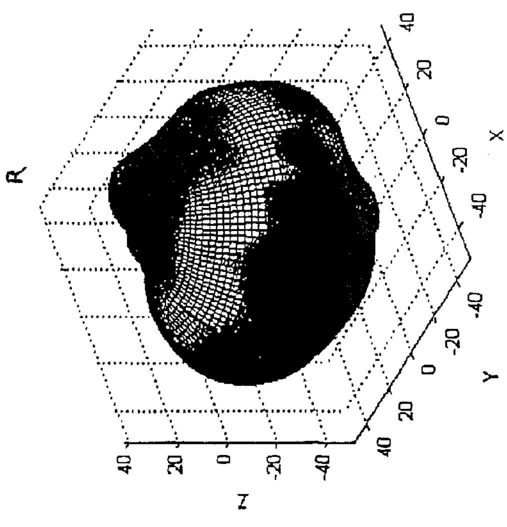
Figure 29:
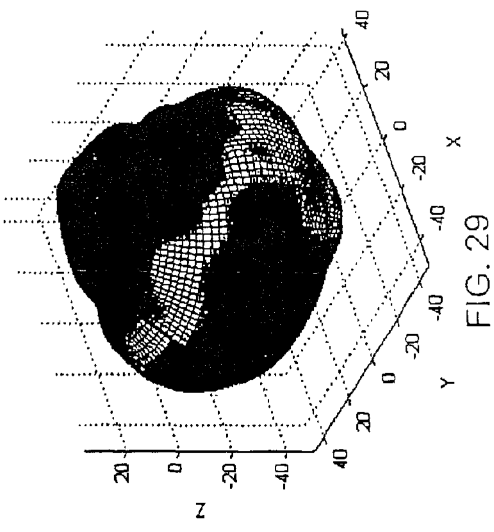

In FIG. 10, the design adjustment process 340 is depicted. If the gain is inadequate at a spatial point, a trial relocation or rotation of an antenna is attempted 342. The performance is measured and a decision is made at 344 as to whether the spatial performance (i.e., antenna pattern) is better or worse. If the spatial performance is worse, the rotation and/or translation is removed at 346 and a new try is made at 342. In this instance, better means that the spatial performance at one required frequency is met. If the performance is better as tested at 344, then the antennas are adjusted. Beginning with the antenna that has the best performance as measured by gain uniformity over the frequency band, the antenna is adjusted at 350 by trimming the size of the antenna or adding to the size of the antenna. Typically, this is done by trimming a copper clad epoxy-glass substrate with a sharp knife or by adding conductive foil to extend the size of the antenna. This process may be guided by known antenna design techniques. Once adjusted, the antenna is tested for spectral uniformity at 352, and if the uniformity requirement is not yet met, the trim/add is undone at 354 and the adjusting of the antenna is done again. After one antenna is adjusted, the next antenna in the antenna system is similarly adjusted until all antennas provide a suitable uniform spectral response, at which time, the adjustment process 340 is done at 360.

In FIG. 9, after the adjustment process 340 is completed a new measurement is made at 310 and analyzed at 320. This process is repeated until done at 330.

Having described preferred embodiments of a novel antenna system and method of making an antenna system (which are intended to be illustrative and not limiting), it is noted that modifications and variations can be made by persons skilled in the art in light of the above teachings. It is therefore to be understood that changes may be made in the particular embodiments of the invention disclosed which are within the scope of the invention as defined by the appended claims.

Having thus described the invention with the details and particularity required by the patent laws, what is claimed and desired protected by Letters Patent is set forth in the appended claims.

What is claimed is:

1. An antenna system comprising:

at least a first antenna having an insulating substrate and a conductive radiating element, the radiating element being substantially planar in shape along its edges;

at least a second antenna having an insulating substrate and a conductive radiating element the radiating element being substantial) planar in shale along its edges;

at least one coupler having a first signal connector, a second signal connector and an insulator isolating the first and second signal connectors, the first signal connector electrically connected to the radiating element of the first antenna; and at least three grounding planes for the antennas, the grounding planes comprising conductive plates electrically isolated from the antennas, wherein the grounding planes have relative potentials with respect to each other and in use the grounding planes are inductively coupled to the antennas whereby the radiation pattern of at least one antenna is substantially ellipsoidal in shape.

2. The antenna system of claim 1 wherein at least a portion of the plane of the radiating element of the first antenna is oblique in respect to at least a portion of the plane of the radiating element of the second antenna.

3. The antenna system of claim 1 wherein at least a portion of the plane of the radiating element of the first antenna is parallel to at least a portion of the plane of the radiating element of the second antenna.

4. The antenna system of claim 1 further comprising a first and second feed, and a ground conductor wherein the radiating element of the first antenna is electrically connected to the first feed and the ground conductor is electrically connected to the second feed, and further wherein the first signal connector is electrically connected to the first feed and the second signal connector is electrically connected to the second feed and the radiating element of the first antenna is inductively coupled upon the ground conductor.

5. The antenna system of claim 1 wherein the first antenna further comprises a coupling conductor, a second radiating element, a first conductor and a second conductor, the first radiating element of the first antenna electrically connected to the first conductor and the second radiating element of the first antenna electrically connected to the second conductor and the coupling conductor electrically connecting the second radiating element of the first antenna to the first conductor, wherein the first signal conductor is coupled to the second conductor and the second signal conductor is coupled to the first radiating element of the first antenna.

6. The antenna system of claim 5 wherein the insulating substrate of the first antenna has an obverse side and a reverse side; and the first radiating element and the first conductor of the first antenna are disposed on the obverse side and the second radiating element and the second conductor of the first antenna are disposed on the reverse side, and the coupling conductor electrically couples the second radiating element and the first conductor of the first antenna through the insulating substrate.

7. The antenna system of claim 1 wherein the second antenna includes a second insulating substrate extending in the plane of the second antenna, a ground conductor, a second coupler and a feed;

the second coupler includes a first signal conductor and a second signal conductor;

the first signal conductor of the second coupler is coupled to the radiating element of the second antenna; and the second signal conductor of the second coupler is coupled to the second conductor.

8. The antenna system of claim 1 further comprising at least one antenna comprising a wire wound a plurality of turns around an insulating substrate and a tap conductor, wherein the first end of the wire is electrically coupled to the second signal conductor and the tap conductor is electrically coupled between the first signal conductor and one of the plurality of turns of the wire.

9. The antenna system of claim 1 wherein the system comprises at least three antennas, wherein the plane of the first antenna is oblique to the plane of the third antenna.

10. The antenna system of claim 9 wherein the plane of the first antenna is substantially parallel to the plane of the second antenna.

11. The antenna system of claim 1 wherein at least one of the grounding planes is parallel with at least one of the radiating elements of the antennas.

12. The antenna system of claim 1 wherein at least one of the grounding planes is oblique to at least one of the radiating elements of the antennas.

13. The antenna system of claim 1 wherein the grounding planes are parallel to each other.

14. The antenna system of claim 1 wherein at least one of the grounding planes is oblique to at least one of the other grounding planes.

15. The antenna system of claim 1 wherein the system includes more than three grounding planes.

16. The antenna system of claim 1 wherein at least one antenna is configured to transmit electromagnetic radiation which is circularly polarized.

17. The antenna system of claim 1 wherein the first and second antennas are configured to transmit electromagnetic radiation which is circularly polarized.

18. The antenna system of claim 1 wherein all the antennas are configured to transmit electromagnetic radiation which is circularly polarized.

19. A method of creating a three dimensional radiation pattern from an antenna system that is substantially ellisoidal in shape comprising:

(a) measuring the radiation pattern of the antenna system over a specified frequency band;

(b) analyzing the radiation pattern of the antenna system over the specified frequency band;

(c) adjusting a rotational location of an antenna or spatial separation between antennas in the antenna system when the antenna system fails to provide the three dimensional radiation pattern required over a specified frequency band; and (d) adjusting the size and shape of an antenna in the antenna system when the antenna system fails to provide the three dimensional radiation pattern required over a specified frequency band.

20. An antenna system comprising:

at least a first antenna having an insulating substrate and a conductive radiating element, the radiating element being substantially planar in shape along its edges;

at least a second antenna having a conductive radiating element, the radiating element being substantially planar in shape along its edges;

at least one coupler having a first signal connector, a second signal connector and an insulator isolating the first and second signal connectors, the first signal connector electrically connected to the radiating element of the first antenna; and at least three grounding planes for the antennas, the grounding planes comprising conductive plates electrically isolated from the antennas, wherein the grounding planes have relative potentials with respect to each other and in use the grounding planes are inductively coupled to the antennas whereby the radiation pattern of at least one antenna is substantially ellipsoidal in shape, and wherein at least a portion of the plane of the radiating element of the first antenna is oblique in respect to at least a portion of the plane of the radiating element of the second antenna.

21. The antenna system of claim 20 having at least a third antenna having a conductive radiating element that is substantially planar in shape along its edges wherein at least a portion of the plane of the radiating element of the first antenna is parallel to at least a portion of the plane of the radiating element of the third antenna.

22. The antenna system of claim 20 further comprising a first and second feed, and a ground conductor wherein the radiating element of the first antenna is electrically connected to the first feed and the ground conductor is electrically connected to the second feed, and further wherein the first signal connector is electrically connected to the first feed and the second signal connector is electrically connected to the second feed and the radiating element of the first antenna is inductively coupled upon the ground conductor.

23. The antenna system of claim 20 further comprising a coupling conductor, a second radiating element of the first antenna, a first conductor and a second conductor, the first radiating element of the first antenna is electrically connected to the first conductor and the second radiating element of the first antenna is electrically connected to the second conductor and the coupling conductor electrically connecting the second radiating element of the first antenna to the first conductor, wherein the first signal conductor is coupled to the second conductor and the second signal conductor is coupled to the first radiating element of the first antenna.

24. The antenna system of claim 23 wherein the insulating substrate has an obverse side and a reverse side; and the first radiating element of the first antenna and the first conductor are disposed on the obverse side and the second radiating element of the first antenna and the second conductor are disposed on the reverse side, and the coupling conductor electrically couples the second radiating element of the first antenna and the first conductor through the insulating substrate.

25. The antenna system of claim 20 wherein the second antenna includes a second insulating substrate extending in the plane of the second antenna, a ground conductor, a second coupler and a feed;

the second coupler includes a first signal conductor and a second signal conductor;

the first signal conductor of the second coupler is coupled to the radiating element of the second antenna; and the second signal conductor of the second coupler is coupled to the second conductor.

26. The antenna system of claim 20 wherein there is at least one antenna comprises a wire wound a plurality of turns around an insulating substrate and a tap conductor, wherein the first end of the wire is electrically coupled to the second signal conductor and the tap conductor is electrically coupled between the first signal conductor and one of the plurality of turns of the wire.

27. The antenna system of claim 20 wherein the system comprises at least three antennas, wherein the plane of the first antenna is oblique to the plane of the third antenna.

28. The antenna system of claim 27 wherein the plane of the first antenna is substantially parallel to the plane of the second antenna.

29. The antenna system of claim 20 wherein at least one of the grounding planes is parallel with at least one of the radiating elements of the antennas.

30. The antenna system of claim 20 wherein at least one of the grounding planes is oblique to at least one of the radiating elements of the antennas.

31. The antenna system of claim 20 wherein the grounding planes are parallel to each other.

32. The antenna system of claim 20 wherein at least one of the grounding planes is oblique to at least one of the other grounding planes.

33. The antenna system of claim 20 wherein the system includes more than three grounding planes.

34. The antenna system of claim 20 wherein the antenna is oriented to transmit electromagnetic radiation which is circularly polarized.

35. The antenna system of claim 20 wherein the first and second antennas are configured to transmit electromagnetic radiation which is circularly polarized.

36. The antenna system of claim 20 wherein all the antennas are configured to transmit electromagnetic radiation which is circularly polarized.

37. An antenna system comprising:

at least a first antenna having an insulating substrate and a conductive radiating element, the radiating element being substantially planar in shape along its edges;

at least a second antenna having a conductive radiating element, the radiating element being substantially planar in shape along its edges;

at least one coupler having a first signal connector, a second signal connector and an insulator isolating the first and second signal connectors, the first signal connector electrically connected to the radiating element of the first antenna; and at least three grounding planes for the antennas, the grounding planes comprising conductive plates electrically isolated from the antennas, wherein the grounding planes have relative potentials with respect to each other and in use the grounding planes are inductively coupled to the antennas whereby the radiation pattern of at least one antenna is substantially ellipsoidal in shape, wherein at least a portion of the plane of the radiating element of the first antenna is parallel to at least a portion of the plane of the radiating element of the second antenna.

38. The antenna system of claim 37, further comprising a plurality of antennas, each antenna having an insulating substrate and a conductive radiating element, the radiating element being substantially planar in shape along its edges.

39. The antenna system of claim 37 having at least a third antenna wherein at least a portion of the plane of the radiating element of the first antenna is oblique in respect to at least a portion of the plane of the radiating element of the third antenna.

40. The antenna system of claim 37 further comprising a first and second feed, and a ground conductor wherein the radiating element of the first antenna is electrically connected to the first feed and the ground conductor is electrically connected to the second feed, and further wherein the first signal connector is electrically connected to the first feed and the second signal connector is electrically connected to the second feed and the radiating element of the first antenna is inductively coupled upon the ground conductor.

41. The antenna system of claim 37 further comprising a coupling conductor, a second radiating element of the first antenna, a first conductor and a second conductor, the first radiating element of the first antenna electrically connected to the first conductor and the second radiating element of the first antenna electrically connected to the second conductor and the coupling conductor electrically connecting the second radiating element of the first antenna to the first conductor, wherein the first signal conductor is coupled to the second conductor and the second signal conductor is coupled to the first radiating element of the first antenna.

42. The antenna system of claim 41 wherein the insulating substrate has an obverse side and a reverse side; and the first radiating element of the first antenna and the first conductor are disposed on the obverse side and the second radiating element of the first antenna and the second conductor are disposed on the reverse side, and the coupling conductor electrically couples the second radiating element of the first antenna and the first conductor through the insulating substrate.

43. The antenna system of claim 37 wherein the second antenna includes a second insulating substrate extending in the plane of the second antenna, a ground conductor, a second coupler and a feed;

the second coupler includes a first signal conductor and a second signal conductor;

the first signal conductor of the second coupler is coupled to the radiating element of the second antenna; and the second signal conductor of the second coupler is coupled to the second conductor.

44. The antenna system of claim 37 wherein there is at least one antenna comprises a wire wound a plurality of turns around an insulating substrate and a tap conductor, wherein the first end of the wire is electrically coupled to the second signal conductor and the tap conductor is electrically coupled between the first signal conductor and one of the plurality of turns of the wire.

45. The antenna system of claim 37 wherein the system comprises at least three antennas, wherein the plane of the first antenna is oblique to the plane of the third antenna.

46. The antenna system of claim 45 wherein the plane of the first antenna is substantially parallel to the plane of the second antenna.

47. The antenna system of claim 37 wherein at least one of the grounding planes is parallel with at least one of the radiating elements of the antennas.

48. The antenna system of claim 37 wherein at least one of the grounding planes is oblique to at least one of the radiating elements of the antennas.

49. The antenna system of claim 37 wherein the grounding planes are parallel to each other.

50. The antenna system of claim 37 wherein at least one of the grounding planes is oblique to at least one of the other grounding planes.

51. The antenna system of claim 37 wherein the system includes more than three grounding planes.

52. The antenna system of claim 37 wherein the antenna is oriented to transmit electromagnetic radiation which is circularly polarized.

53. The antenna system of claim 37 wherein the first and second antennas are configured to transmit electromagnetic radiation which is circularly polarized.

54. The antenna system of claim 37 wherein all the antennas are configured to transmit electromagnetic radiation which is circularly polarized.

* * * * *